United States Patent
Zhang et al.

(10) Patent No.: US 12,136,547 B1
(45) Date of Patent: Nov. 5, 2024

(54) SYSTEM AND METHOD FOR IMPROVING THE RELEASE OF CHIPS IN THE LASER PERFORATION OF THIN FILMS

(71) Applicant: Xerox Corporation, Norwalk, CT (US)

(72) Inventors: Robert Jian Zhang, Brighton, NY (US); George Leonidas Vassilaros, Rochester, NY (US); Michael Stephen Roetker, Webster, NY (US); Scott Joseph Griffin, Fairport, NY (US)

(73) Assignee: XEROX CORPORATION, Norwalk, CT (US)

( * ) Notice: Subject to any disclaimer, the term of this patent is extended or adjusted under 35 U.S.C. 154(b) by 489 days.

(21) Appl. No.: 17/382,463

(22) Filed: Jul. 22, 2021

(51) Int. Cl.
*H01L 21/02* (2006.01)
*B23K 26/382* (2014.01)

(52) U.S. Cl.
CPC ...... *H01L 21/02675* (2013.01); *B23K 26/382* (2015.10)

(58) Field of Classification Search
CPC .......... H01L 21/02675; B23K 26/382

USPC .................................................. 219/121.85
See application file for complete search history.

(56) References Cited

U.S. PATENT DOCUMENTS

| 5,257,037 A | * | 10/1993 | Haneda | H04N 1/047 399/178 |
| 9,642,751 B2 | * | 5/2017 | Imai | B23K 26/082 |

* cited by examiner

*Primary Examiner* — Dana Ross
*Assistant Examiner* — Joseph W Iskra
(74) *Attorney, Agent, or Firm* — Simpson & Simpson, PLLC

(57) ABSTRACT

A laser perforation system, including a drive roller, a tensioner roller spaced apart from the drive roller, a thin film belt arranged around both the drive roller and tensioner roller, the thin film belt including a front surface facing radially outward and a rear surface facing radially inward, a backstop arranged radially within the thin film belt, and a laser head arranged proximate the front surface, the laser head operatively arranged to direct a laser at the thin film belt to create holes therein.

13 Claims, 7 Drawing Sheets

SYSTEM AND METHOD FOR IMPROVING THE RELEASE OF CHIPS IN THE LASER PERFORATION OF THIN FILMS

FIELD

The present disclosure relates to the field of perforating thin films, and more particularly, to forming holes in a thin film by releasing chips therefrom, and even more particularly, printing, and more particularly, to a system and method for improving the release of chips from thin films.

BACKGROUND

The conventional method for perforating thin films is through the metal stamping process, in which pins matching hole features on a belt are punched through the film and into an opposing plate. Marking or cutting objects using a laser has been a relatively novel and developing technology, but its application with respect to the perforation of thin films is limited. For example, its application may be limited by, inter alia, the extent to which the heat affected zone can be localized and ablation damage is minimized.

Additionally, there are several problems encountered in the laser perforation process. Defects from laser perforation not seen in metal stamping include, but are not limited to: burrs along the cut perimeter on the forward-facing and back-facing surfaces, resulting in a stiff raised edge at the perimeter of a hole that may be caused by a knife hitting a flash defect or deburring (i.e., pluck), image quality defects, etc.; thin or loose material around the cut (i.e., flash); chips hanging or not fully released from the cut/hole (i.e., hanging chad); speckled or not smooth cut lines; and soot from the vaporization or ablation of material. Chips are defined as the small circles (or other shapes) formed when a hole is punched (or in this case, cut by laser) in a card or paper. Another issue is a potentially long cycle time, depending on the belt size, number of features, and machine implementation.

Therefore, there is a long felt need for a system and method for releasing chips from thin films during laser perforation that avoids the above listed drawbacks.

SUMMARY

According to aspects illustrated herein, there is provided a laser perforation system, comprising a drive roller, a tensioner roller spaced apart from the drive roller, a thin film belt arranged around both the drive roller and tensioner roller, the thin film belt including a front surface facing radially outward and a rear surface facing radially inward, a backstop arranged radially within the thin film belt, and a laser head arranged proximate the front surface, the laser head operatively arranged to direct a laser at the thin film belt to create holes therein.

In some embodiments, the tensioner roller is displaceable with respect to the drive roller. In some embodiments, the laser perforation system further comprises a blade operatively arranged to engage one or more deflected chips on the thin film belt. In some embodiments, the blade is arranged radially inside of the thin film belt and engages the rear surface. In some embodiments, the blade is arranged radially outside of the thin film belt and engages the front surface. In some embodiments, the drive roller is operatively arranged to displace the thin film belt in a first direction. In some embodiments, the laser head is displaceable with respect to the thin film belt in a second direction and a third direction, the second direction and third direction being perpendicular to the first direction. In some embodiments, the laser perforation system further comprises an edge sensor operatively arranged to detect displacement of the thin film belt relative to the drive roller or the tensioner roller in the second direction and the third direction. In some embodiments, the drive roller comprises a first diameter, the tensioner roller comprises a second diameter, and the second diameter is less than the first diameter. In some embodiments, the laser perforation system further comprises at least one outlet operatively arranged to remove smoke created by the laser contacting the thin film belt and/or the backstop. In some embodiments, the at least one outlet comprises a first outlet arranged radially inside the thin film belt, and a second outlet arranged radially outside the thin film belt. In some embodiments, the thin film belt comprises one of polyethylene terephthalate (PET), polyethylene naphthalate (PEN), and polyamide. In some embodiments, the laser head comprises an ultraviolet (UV) laser marker.

According to aspects illustrated herein, there is provided a method of perforating a thin film, comprising directing, by a laser head, a laser onto the thin film along a first laser path at least one time, the first laser path defining a hole perimeter, directing, by the laser head, the laser onto the thin film along a second laser path, the second laser path extending from a center point of the hole to at least partially to the hole perimeter, at least partially deflecting a chip with respect to the thin film, the chip defined by the hole perimeter, and removing, by a blade, the at least partially deflected chip from the thin film to form a hole therein by displacing the thin film in a first direction with respect to the blade.

In some embodiments, the step of directing, by the laser head, the laser onto the thin film along the first laser path at least one time comprises directing, by the laser head, the laser onto the thin film along the first laser path a first time, and directing, by the laser head, the laser onto the thin film along the first laser path a second time. In some embodiments, the method further comprises removing, by at least one outlet, smoke created from contact between the laser and the thin film. In some embodiments, the second laser path extends from the center point of the hole linearly to the hole perimeter. In some embodiments, the second laser path extends from the center point of the hole toward the hole perimeter in the first direction. In some embodiments, the method further comprises displacing the laser head in a second direction with respect to the thin film, the second direction being perpendicular to the first direction. In some embodiments, the method further comprises detecting, by an edge sensor, movement of the thin film in a second direction, the second direction being perpendicular to the first direction, and communicating, by a transmitter, the movement to a controller. In some embodiments, the laser head is arranged on a first side of the thin film and the step of at least at least partially deflecting the chip with respect to the thin film comprises displacing at least a portion of the chip, using the laser along the second laser path, toward a second side of the thin film, opposite the first side. In some embodiments, the laser head is arranged on a first side of the thin film and the step of at least at least partially deflecting the chip with respect to the thin film comprises displacing at least a portion of the chip, using a roller, toward the first side.

According to aspects illustrated here, there is provided a method for improving the release of chips in the laser perforation of thin films. The method involves adding a path from the center of the hole (circular or otherwise) to the perimeter, effectively a radius cut, to help push the chip away from the plane of the thin film. The laser unit and thin film belt are mounted vertically. In some embodiments, the radial cut need not be a line, cut can be any shape or pattern suitable for deflecting the chip with respect to the thin film belt, for example, a curvilinear line, a triangle, square, circle, etc. In some embodiments, the radial cut extends completely from the center point of the chip to the perimeter. In some embodiments, the radial cut does not extend completely from the center point of the chip to the perimeter. In some embodiments, the radial line or cut is made beginning at the center point of the chip moving toward the perimeter. In some embodiments, the radial line or cut is made beginning at the perimeter of the chip and moving toward the center point of the chip.

According to aspects illustrated herein, there is provide a system for laser perforating a thin film belt comprising a laser head, a drive roller, a tensioner roller displaceably arranged with respect to the drive roller, a thin film belt operatively arranged around the drive roller and the tensioner roller, and a deburring blade arranged proximate the thin film belt. In some embodiments, the deburring blade is arranged on a radially inward side of the thin film belt. In some embodiments, the laser head is arranged on a radially outward side of the thin film belt. In some embodiments, the system for laser perforating a thin film belt further comprises an edge sensor arranged proximate the thin film belt, the edge sensor operatively arranged to detect lateral movement of the thin film belt and communicate such movement to a controller, such that the controller adjusts the laser head to correspond to the lateral movement.

In some embodiments, the system for laser perforating a thin film belt further comprises an exhaust. In some embodiments, the system for laser perforating a thin film belt further comprises a light stack. In some embodiments, the laser head is arranged approximately one foot away from the thin film belt. In some embodiments, the system comprises two laser heads. Having more than one lasers allows cuts to be made with less angle, thereby limiting defects. In some embodiments, the laser head is an ultraviolet (UV) laser marker, for example, the KEYENCE® MD-U1020 laser marker including a wavelength of 355 nm.

In some embodiments, a laser path on a thin film belt as defined by the hole cut pattern (circular or otherwise) can be modified to incorporate design elements, such as a radial cut, inside the actual hole perimeter, in order to energize and improve the release of the chip. First, in the separation stage, the hole's perimeter is cut such that the burr wants to separate from the material. In some embodiments, the laser may cut along the same perimeter path two times. Second, in the pushing stage, a radial cut is made to push the burr inward (toward the deburring blade) at a desired angle. Third, in a cleaning stage, the deburring blade engages the radially inwardly bent chips to engage and remove the cut/dangling chips. It should be appreciated that the displaced edge of the chip should be directed toward the deburring blade. In some embodiments, the laser fully ablates the hole (i.e., for very small holes).

Some advantages of the present disclosure are: 1) it reduces the number of passes required to release the chip from a cut, which leads to a lower temperature at the heat affected zone (i.e., the more passes the laser makes the hotter the material gets); 2) it reduces the amount of time needed to cut a thin film belt; and, 3) it reduces the risk of ablation damage and minimizes burrs at the cut perimeter.

In some embodiments, the thin film belt comprises polyethylene terephthalate (PET). In some embodiments, the thin film belt comprises polyethylene naphthalate (PEN). In some embodiments, the thin film belt comprises polyamide.

In some embodiments, the laser head is displaceable to reduce cut angularity and thus defects. In such embodiments, the laser head is mounted on a linear motion system such that it is displaceable along the x-axis, where the y-axis is the direction of travel for the belt or sheet material and the z-axis is the focus depth and general direction of the laser beam (i.e., direction extending from the laser head to the thin film belt). The laser head can cut features up to a maximum angle relative to the z-axis before the controller must reposition it. The free motion along the x-axis eliminates the need to make wide angle cuts and enables the perforation of wider thin film belts.

In some embodiments, the laser head is mounted to a traversable plate. Linear motion can be achieved using a rack-and-pinion, lead/ball screw and rail, or other suitable means for displaceable mounting the laser head with respect to the belt. Motion feedback is directed to the controller, which communicates to the laser head what portion of the defined cut pattern needs to be cut at the current head position.

Some advantages of the present disclosure are: 1) it eliminates the need for wide angle cuts, which require more energy; 2) the chips are released more easily from the cut site when the walls of the cut are straight and there is less contact area; and, 3) it improves the visual quality when the cut path is perpendicular to the belt surface.

According to aspects illustrated herein, there is provided a system and method of releasing perforated chips by sharp wrap angle. The thin film belt is held in tension by at least two rollers inside a laser perforation machine or system. By decreasing the diameter of one of the rollers or incorporating a third small roller creates a sharp bend along the belt path to help free any chips or other material stuck inside a cut hole. In some embodiments, the system further comprises an airstream against the exterior of the belt to further enhance the release of a chip wedged in the hole. In some embodiments, the system further comprises a knife or a deburring blade operatively arranged to engage the partially removed chips to further enhance the release of a wedged chip and removal of flash around the perimeter of the hole.

The sharp bend along the belt path can enhance the release of chips or other materials lodged inside a cut hole. This geometry can be achieved by decreasing the tensioner roller diameter, or adding one or more small rollers to the belt path. For example, a tensioner roller having a diameter of 48 mm may be decreased to 20 mm or less. The airstream may be aimed at the curve of the belt to enhance the release of any debris from the hole. The knife provides the added benefit of cutting any flash around the perimeter hole.

Some advantages of the present disclosure are: 1) it delivers a cleaner belt and without committing additional resources; 2) it reduces the risk of an operator damaging the belt by reducing excess manipulation; and, 3) it improves customer satisfaction by reducing the probability of a chip being in the packaged product.

According to aspects illustrated herein, there is provided a system and method of clearing smoke in the laser perforation process. To achieve such result, controlled airflow is introduced into the laser perforation process to eliminate smoke and improve the laser cut quality. One or more intake nozzles draw in air near the belt surface or backstop where the laser can cut and into an external air extraction system. The airway can be manually or selectively opened by an operator or controller.

In some embodiments, an exhaust system is incorporated into a laser perforation machine. A nozzle (e.g., a pipe with an open slot) is mounted to the frame of the machine and connected to an external air extraction system. The extraction system is set to an approximate nominal rate of 66 cubic feet per minute (cfm) and can reach 266 cfm. The nozzle can be as wide as the belt and it is mounted parallel to the surface of the thin film, close to the region where the laser can cut. A nozzle or a plurality of nozzles draw in smoke arising from the burning and vaporization of material during laser ablation. These nozzles can be placed exterior and/or interior to the belt. The interior nozzle has the added benefits of removing smoke from the laser path to the belt and smoke generated from the backplate. The nozzles can be kept open during the entire operation or selectively open by the controller based on various conditions such as: moments when the laser is active, more aggressive cut patterns, and different belt materials.

Some advantages of the present disclosure are: 1) it enhances the cut quality of the laser-smoke has been shown to diffract the laser and reduce the quality, namely, cleanliness, of the cut; 2) it reduces the amount of soot and other residuals on the thin film surface, which is especially critical on the translucent amber dryer belts; 3) it improves the air quality and limits odor within the chamber, which may affect operators; and, 4) it may help keep the belt cool and limit the heat affected zone of laser ablation.

These and other objects, features, and advantages of the present disclosure will become readily apparent upon a review of the following detailed description of the disclosure, in view of the drawings and appended claims.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

Figure 1:
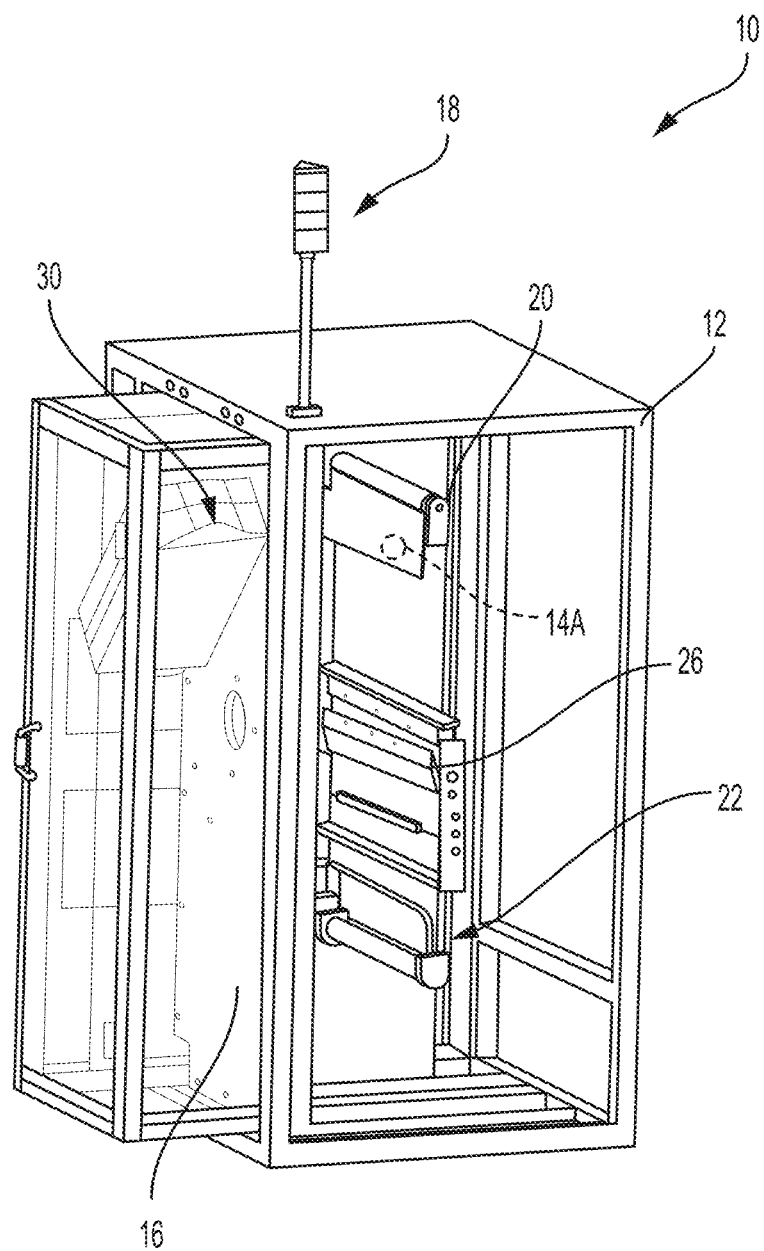
FIG. 1 is a perspective view of a laser perforation system.

At the outset, it should be appreciated that like drawing numbers on different drawing views identify identical, or functionally similar, structural elements. It is to be understood that the claims are not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the claims.

Unless defined otherwise, all technical and scientific terms used herein have the same meaning as commonly understood to one of ordinary skill in the art to which this disclosure pertains. It should be understood that any methods, devices or materials similar or equivalent to those described herein can be used in the practice or testing of the example embodiments. The assembly of the present disclosure could be driven by hydraulics, electronics, pneumatics, and/or springs.

It should be appreciated that the term "substantially" is synonymous with terms such as "nearly," "very nearly," "about," "approximately," "around," "bordering on," "close to," "essentially," "in the neighborhood of," "in the vicinity of," etc., and such terms may be used interchangeably as appearing in the specification and claims. It should be appreciated that the term "proximate" is synonymous with terms such as "nearby," "close," "adjacent," "neighboring," "immediate," "adjoining," etc., and such terms may be used interchangeably as appearing in the specification and claims. The term "approximately" is intended to mean values within ten percent of the specified value.

It should be understood that use of "or" in the present application is with respect to a "non-exclusive" arrangement, unless stated otherwise. For example, when saying that "item x is A or B," it is understood that this can mean one of the following: (1) item x is only one or the other of A and B; (2) item x is both A and B. Alternately stated, the word "or" is not used to define an "exclusive or" arrangement. For example, an "exclusive or" arrangement for the statement "item x is A or B" would require that x can be only one of A and B. Furthermore, as used herein, "and/or" is intended to mean a grammatical conjunction used to indicate that one or more of the elements or conditions recited may be included or occur. For example, a device comprising a first element, a second element and/or a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element.

Moreover, as used herein, the phrases "comprises at least one of" and "comprising at least one of" in combination with a system or element is intended to mean that the system or element includes one or more of the elements listed after the phrase. For example, a device comprising at least one of: a first element; a second element; and, a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element. A similar interpretation is intended when the phrase "used in at least one of:" is used herein. Furthermore, as used herein, "and/or" is intended to mean a grammatical conjunction used to indicate that one or more of the elements or conditions recited may be included or occur. For example, a device comprising a first element, a second element and/or a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element.

"Thin film" is a layer of material ranging from fractions of a nanometer (monolayer) to several micrometers in thickness. "Thin film belt" as used herein is intended to mean a continuous band of thin film that may contain seams or be seamless. In some embodiments, the thin film belt is operatively arranged to be used as a vacuum transfer belt in a printer or printing device. A "chip" as used herein is a piece of the thin film that has been removed completely or partially from the thin film belt. After removal of the chip, a hole remains in the thin film belt. These holes are also referred to as perforations. As will be described in greater detail below, the chip may comprise an desirable geometry, for example, circular, square, rectangular, ovular, ellipsoidal, polygonal, etc.

Figure 2:
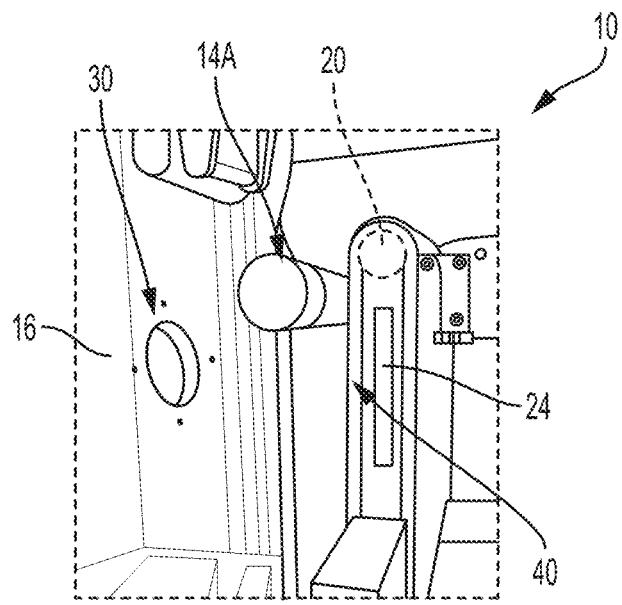
FIG. 2 is a partial perspective view of the laser perforation system shown in FIG. 1.
Figure 3:
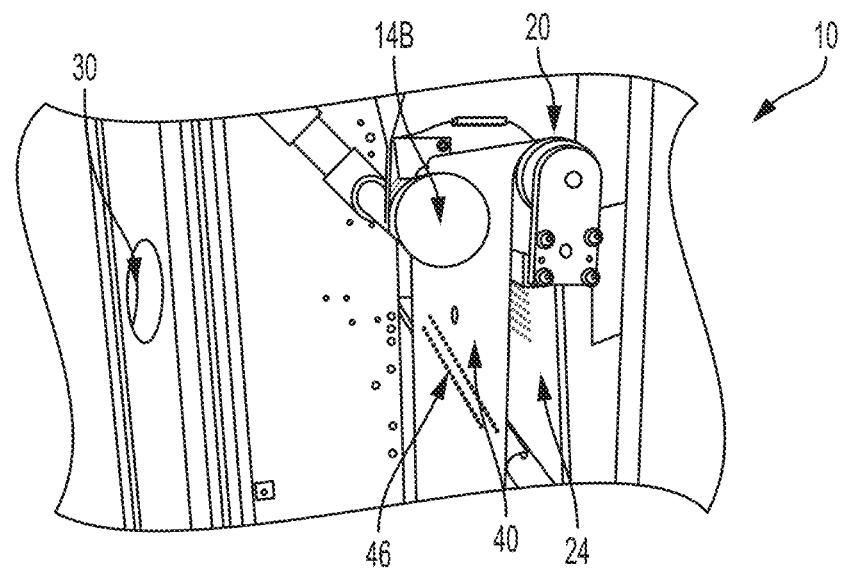
FIG. 3 is a partial perspective view of the laser perforation system shown in FIG. 1.
Figure 4:
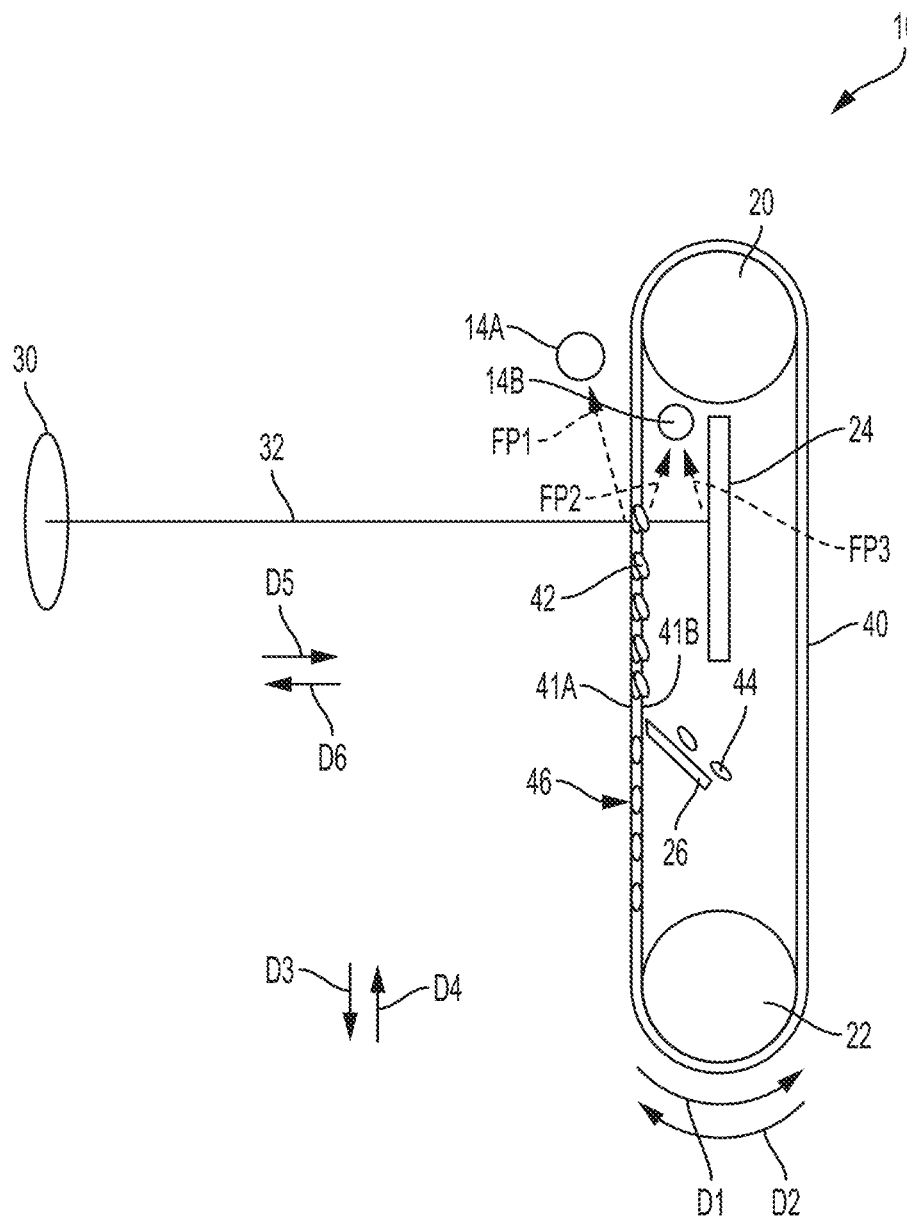
FIG. 4 is a side elevational schematic view of the laser perforation system shown in FIG. 1.

Referring now to the figures, FIG. 1 is a perspective view of laser perforation system 10. FIG. 2 is a partial perspective view of laser perforation system 10. FIG. 3 is a partial perspective view of laser perforation system 10. FIG. 4 is a side elevational schematic view of laser perforation system 10. Laser perforation system 10 generally comprises drive roller 20, tensioner roller 22, backstop 24, and laser head 30. Thin film belt 40 is operatively arranged around drive roller 20 and tensioner roller 22. In some embodiments, laser perforation system 10 further comprises enclosure 12 in which the various elements are arranged. In some embodiments, laser perforation system 10 further comprises light stack 18 operatively arranged to indicate a status thereof. The following description should be read in view of FIGS. 1-4.

Drive roller 20 is rotatably arranged in enclosure 12. Tensioner roller 22 is spaced apart from drive roller 20 and is rotatably arranged in enclosure 12. Drive roller 20 and tensioner roller 22 engage thin film belt 40 such that it rotates thereabout. Tensioner roller 22 is displaceable in direction D3 and direction D4 with respect to drive roller 20. Tensioner roller 22 is operatively arranged to apply a force on thin film belt 40 to create or maintain tension therein. Drive roller 20 is operatively arranged to drive belt 40 in a generally circumferential direction, for example, direction D1. In some embodiments, drive roller 20 is connected to a motor or other drive mechanism. In some embodiments, the diameter of drive roller 20 and the diameter of tensioner roller 22 are substantially the same. In some embodiments, the diameter of drive roller 20 and the diameter of tensioner roller 22 are not the same, as will be described with greater detail below.

As previously described, thin film belt 40 is arranged around drive roller 20 and tensioner roller 22. Thin film belt 40 comprises front surface 41A and rear surface 41B. Rear surface 41B generally faces radially inward and engages drive roller 20 and tensioner roller 22, to form a belt path. Front surface 41A generally faces radially outward. In some embodiments, thin film belt 40 comprises polyethylene terephthalate (PET). In some embodiments, thin film belt 40 comprises polyethylene naphthalate (PEN). In some embodiments, thin film belt 40 comprises polyamide.

Backstop 24 is arranged radially within thin film belt 40. Backstop 24 is operatively arranged to be aligned with laser head 30 to dissipate laser 32 after it passes through thin film belt 40. Backstop 24 may comprise any material suitable to dissipate laser 32. Deburring blade or blade or skiving knife 26 is arranged radially within thin film belt 40. Blade 26 should be directed toward the displaced or protruding end of the deflected chips, as will be described in greater detail below.

Laser head 30 is arranged proximate to thin film belt 40 and is directed toward front surface 41A, generally in direction D5. Laser head 30 produces laser 32. In some embodiments, laser head 30 is fixedly secured to support 16 and aligned with a hole arranged therein. In some embodiments, laser perforation system 10 comprises a plurality of laser heads fixedly secured to support 16 and aligned with respective holes therein (see additional hole in support 16 shown in FIG. 1). In some embodiments, laser head 30 is displaceable with respect to thin film belt 40, as will be described in greater detail below. In some embodiments, laser head 30 is an ultraviolet (UV) laser marker, for example, the KEYENCE® MD-U1020 laser marker including a wavelength of 355 nm.

Laser head 30 directs laser or laser beam 32 onto thin film belt 40, as best shown in FIG. 4. Laser 32 passes through both front surface 41A and rear surface 41B of thin film belt 40 in order to produce holes therein. In some embodiments, laser 32 forms deflected chips 42, which are partially cut chips wherein a portion of the partially cut chip is displaced radially inward. As thin film belt 40 continues on its path (the deflected portion of deflected chips 42 are directed in direction D3), blade 26 engages the deflected portion of deflected chips 42 thereby removing them from thin film belt 40 as removed chips 40. The result of this process is holes or perforations 46 formed in thin film belt 40.

In some embodiments, laser perforation system 10 further comprises one or more nozzles or exhausts or outlets, for example, outlet 14A and outlet 14B. Outlets 14A-B are operatively arranged proximate thin film belt 40 and backstop 24 to remove smoke arising from the burning and vaporization of thin film belt 40 (and/or backstop 24) during laser cutting/perforation/ablation. In some embodiments, outlet 14A is arranged radially outside of thin film belt 40 and outlet 14B is arranged radially inside of thin film belt 40. It should be appreciated that laser perforation system 10 may comprise a plurality of outlets arranged radially outside of thin film belt 40 and a plurality of outlets inside of thin film belt 40. In some embodiments, outlets 14A-B are arranged in enclosure 12. In some embodiments, a vacuum or an air extraction system is connected to outlets 14A-B to draw smoke away from thin film belt 40 or backstop 24 (i.e., out of enclosure 12). The air extraction system can be set between 66 cubic feet per minute (cfm) and 266 cfm. In some embodiments, air is pumped into enclosure 12 to force smoke out through outlets 14A-B. As best shown in FIG. 4, as laser 32 penetrates thin film belt 40, smoke is created at front surface 41A, rear surface 41B, and backstop 24. Smoke created at front surface 41A is removed from laser perforation system 10 by outlet 14A, as shown by flow path FP1. Smoke created at rear surface 41B is removed from laser perforation system 10 by outlet 14B, as shown by flow path FP2. Smoke created at backstop 24 is removed from laser perforation system 10 by outlet 14B, as shown by flow path FP3. Outlets 14A-B can be kept open during the entire operation or selectively opened by a controller or manually by an operator based on various conditions (e.g., moments when the laser is active, more aggressive cuts, and different belt materials, etc.).

Figure 5:
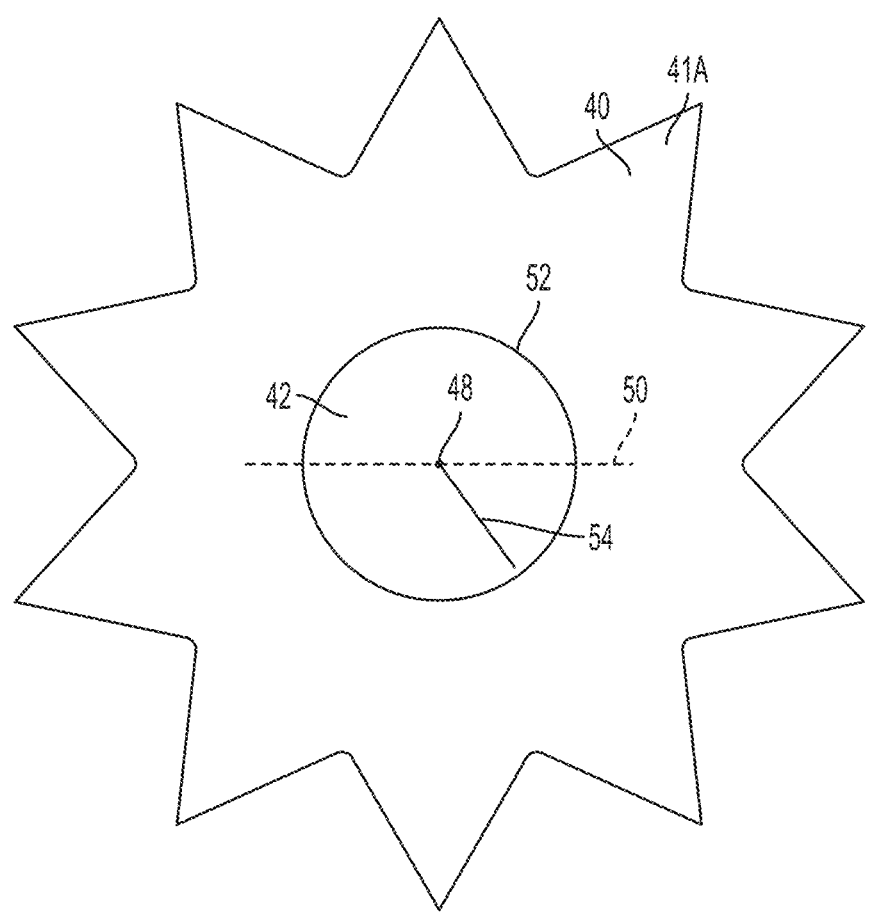
FIG. 5 is a partial front elevational view of the thin film belt shown in FIG. 4.

FIG. 5 is a partial front elevational view of thin film belt 40. Specifically, FIG. 5 shows a layout of a method of removing a chip from thin film belt 40, namely, creating deflected chip 42. Laser path 52 represents the perimeter of chip 42 which may be any desired geometric shape, for example, circular, ovular, ellipsoidal, square, rectangular, polygonal, etc. Chip 42 comprises center point 48. Center point 48 can be the exact center point within perimeter 52 or a point proximate such exact center point. Laser path 54 is a radial path from or from a point proximate to center point 48, to or proximate to perimeter 52.

The following description outlines the method of perforating thin film belt 40, and should be read in view of FIGS. 1-5.

In a first step, laser head 30 directs laser 32 onto thin film belt 40 along laser path 52 one complete time, creating a first perimeter cut in thin film belt 40. Such first pass at least partially cuts through thin film belt 40. In some embodiments, the first perimeter cut creates a groove in thin film belt 40 along laser path 52, extending from front surface 41A generally in direction D5.

In a second step, laser head 30 directs laser 32 onto thin film belt 40 along laser path 52 one complete time, creating a second perimeter cut in thin film belt 40. Such second pass at least partially cuts through thin film belt 40. In some embodiments, the second perimeter cut deepens the groove formed in the first step. In some embodiments, the second perimeter cut extends completely from front surface 41A to rear surface 41B.

In a third step, laser head 30 directs laser 32 onto thin film belt 40 along laser path 54 one complete time. In some embodiments, laser path 54 begins at center point 48 and is directed radially outward toward perimeter 52. In some embodiments, laser path 54 extends to perimeter 52. In some embodiments, laser path 54 extends to a point proximate perimeter 52. As laser 32 contacts chip 42 along laser path 54, chip 42 deflects or displaces relative to thin film belt. For example, and as shown in FIG. 4, the bottom of deflected chips 42 are displaced radially inward from thin film belt 40. This occurs because laser path 54 is a radial cut below line 50. If desired, the top of deflected chips 42 can be displaced radially inward from thin film belt 40 if laser path 54 is changed to be a radial cut above line 50. It should be appreciated that laser path 54 need not be linear, but can be curvilinear or another suitable geometric shape.

In a fourth step, thin film belt 40 is displaced in direction D3 such that blade 26 engages deflected chips 42. Since blade 26 is directed radially outward (i.e., toward rear surface 41B) and upward, it fully cuts and removes deflected chips 42 from thin film belt 40. Blade 26 removes chips 44 from thin film belt 40 thereby forming holes 46 therein. This step can be envisioned as passing thin film belt 40 over statically arranged blade 26 such that deflected chips 42 are fully removed to form holes 46.

In an additional or alternative step, smoke formed from contact between laser 32 and thin film belt 40 and contact between laser 32 and backstop 24 is removed by one or more outlets, for example, outlets 14A-B.

In an additional or alternative step, an air stream is directed, in direction D5, at deflected chips 42 to fully remove them from thin film belt 40 to form holes 46.

Figure 6:
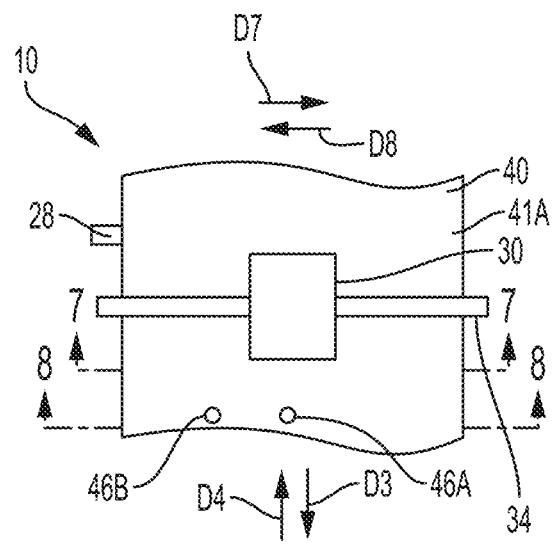
FIG. 6 is a partial front elevational view of the laser perforation system shown in FIG. 4.
Figure 7:
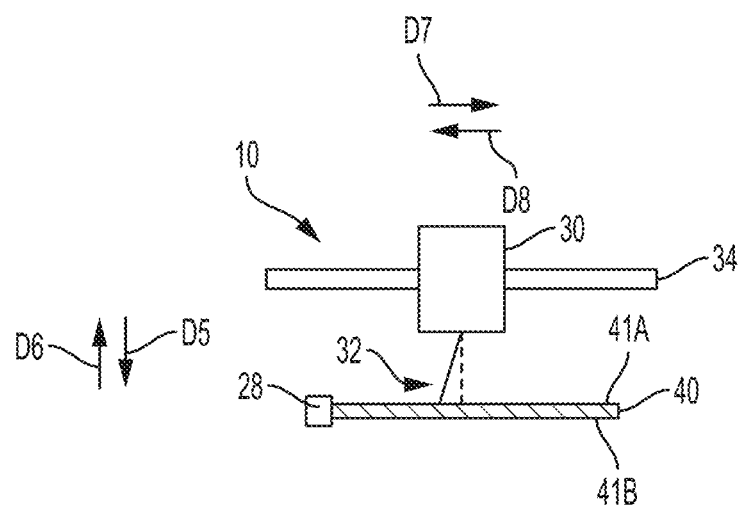
FIG. 7 is a cross-sectional view of the laser perforation system taken generally along line 7-7 in FIG. 6.
Figure 8:
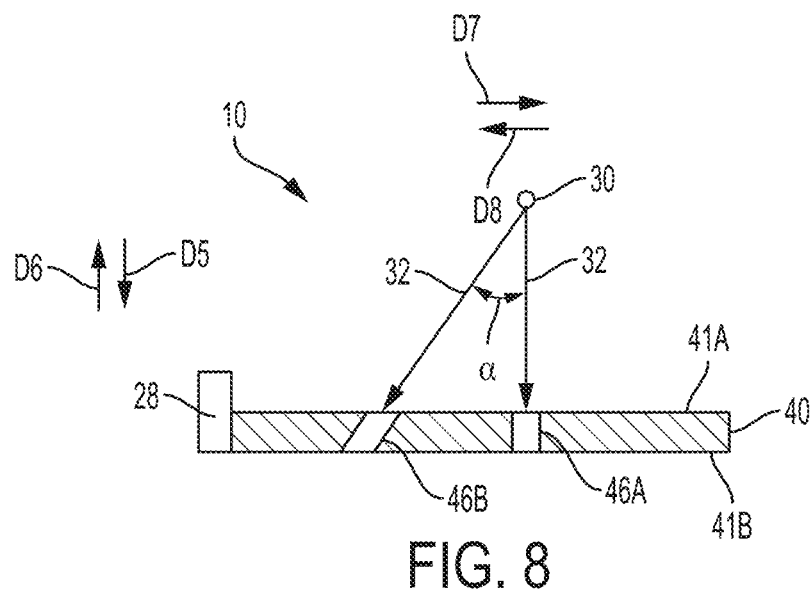
FIG. 8 is a cross-sectional view of the laser perforation system taken generally along line 8-8 in FIG. 6.
Figure 9:
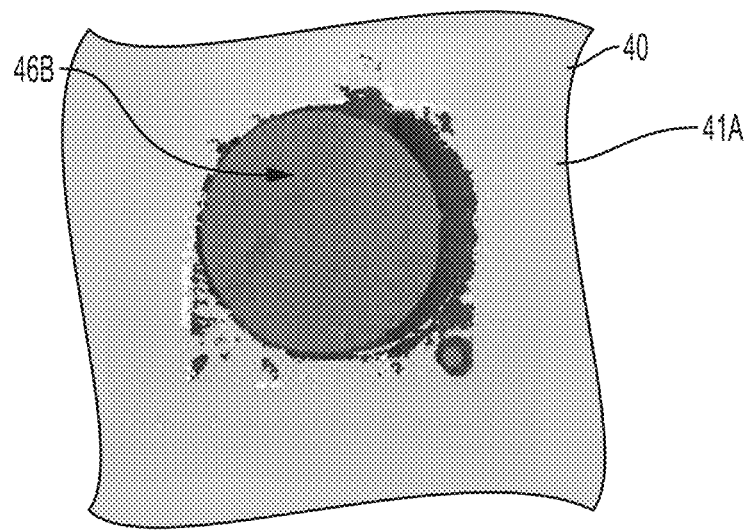
FIG. 9 is a partial front elevational view of the belt shown in FIG. 8.

FIG. 6 is a partial front elevational view of laser perforation system 10. FIG. 7 is a cross-sectional view of laser perforation system 10 taken generally along line 7-7 in FIG. 6. FIG. 8 is a cross-sectional view of laser perforation system 10 taken generally along line 8-8 in FIG. 6. FIG. 9 is a partial front elevational view of belt 40. As shown, in some embodiments, laser head 30 is displaceably and/or slidably connected to track or rod or rail or rack-and pinion or lead/ball screw 34. As such, laser head 30 is displaceable relative to thin film belt 40 in direction D7 and D8. The following description should be read in view of FIGS. 1-9.

Laser head 30 is capable of directing laser 32 directly at thin film belt 40 (i.e., normal vector or perpendicular to front surface 41A) to create hole 46A, or at thin film belt 40 at angle α to create hole 46B. Angle α is measured from the normal vector. As angle α increases, the shape of hole 46 created in thin film belt 40 becomes more susceptible to defects in the hole and/or the chips are less likely to release. By including a displaceable laser head 30, angle α can be reduced and perforation of wider belts can be achieved.

In an additional step, laser head 30 is displaced laterally (i.e., in direction D7 or direction D8) with respect to thin film belt 40. This step may occur before the first perimeter cut is made (i.e., the first step) or after the radial cut is made (i.e., the third step).

In some embodiments, laser perforation system 10 further comprises edge sensor 28 arranged proximate thin film belt 40. Edge sensor 28 is operatively arranged to detect lateral movement of thin film belt 40 and communicate such lateral movement to a controller. Lateral movement of thin film belt 40 may occur is rollers 20 and 22 are not properly aligned, thin film belt 40 is not properly tensioned, or thin film belt is defective. The controller may then displace laser head 30 to adjust for the lateral movement in order to accurately place cuts.

In an additional step, edge sensor 28 detects lateral movement of thin film belt 40 and communicates such lateral movement to a controller. The controller then adjusts laser head 30 for such lateral movement. Edge sensor 28 may communicate the lateral movement to the controller by way of a transmitter.

Figure 10:
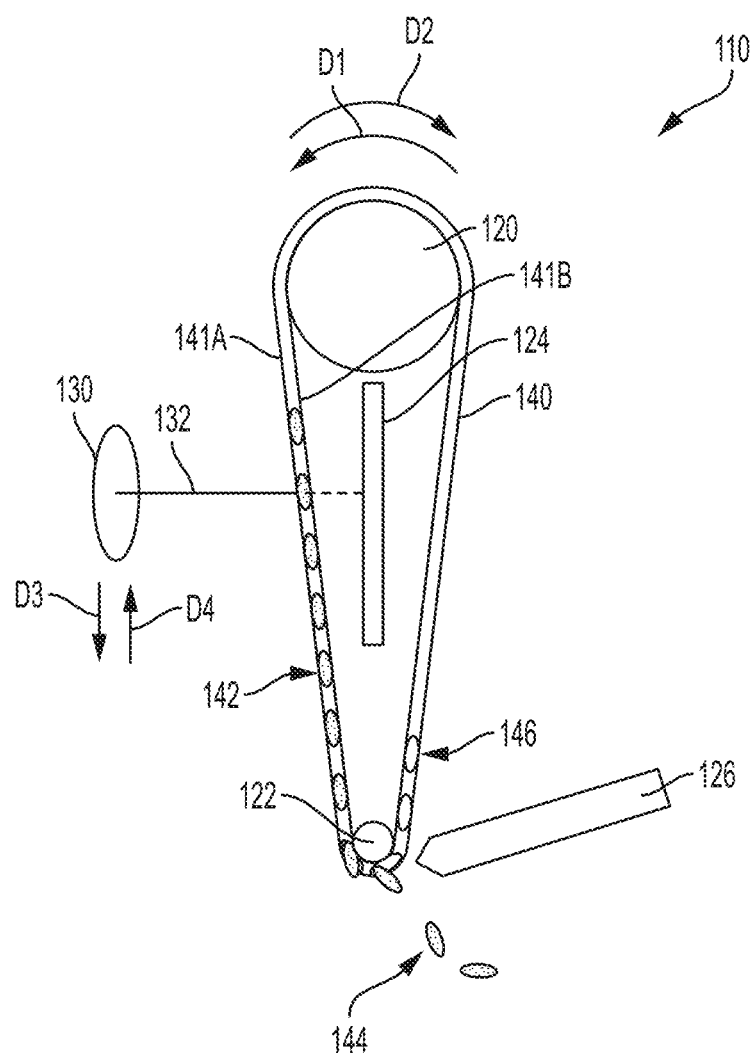
FIG. 10 is a side elevational schematic view of a laser perforation system.

FIG. 10 is a side elevational schematic view of laser perforation system 110. Laser perforation system 110 generally comprises drive roller 120, tensioner roller 122, backstop 124, and laser head 130. Thin film belt 140 is operatively arranged around drive roller 120 and tensioner roller 122. The components of laser perforation system 110 can be embodied in an enclosure, such as enclosure 12 in which the various elements are arranged.

Tensioner roller 122 is spaced apart from drive roller 120, wherein both tensioner roller 122 and drive roller 120 are rotatable. Drive roller 120 and tensioner roller 122 engage thin film belt 140 such that it rotates thereabout. Tensioner roller 122 is displaceable in direction D3 and direction D4 with respect to drive roller 120. Tensioner roller 122 is operatively arranged to apply a force on thin film belt 140 to create or maintain tension therein. Drive roller 120 is operatively arranged to drive belt 140 in a generally circumferential direction, for example, direction D1. In some embodiments, drive roller 120 is connected to a motor or other drive mechanism. In some embodiments, and as shown, the diameter of tensioner roller 122 is less than drive roller 120. By substantially decreasing the diameter of tensioner roller 122, the curvature of the path of thin film belt 140 can be reduced. This reduced curvature tends to cause cut chips 142 to displace radially outward with respect to thin film belt 40, which assists in their total removal.

As previously described, thin film belt 140 is arranged around drive roller 120 and tensioner roller 122. Thin film belt 140 comprises front surface 141A and rear surface 141B. Rear surface 141B generally faces radially inward and engages drive roller 120 and tensioner roller 122, to form a belt path. Front surface 141A generally faces radially outward. In some embodiments, thin film belt 140 comprises polyethylene terephthalate (PET). In some embodiments, thin film belt 140 comprises polyethylene naphthalate (PEN). In some embodiments, thin film belt 140 comprises polyamide.

Backstop 124 is arranged radially within thin film belt 140. Backstop 124 is operatively arranged to be aligned with laser head 130 to dissipate laser 132 after it passes through thin film belt 140. Backstop 124 may comprise any material suitable to dissipate laser 132. Deburring blade or blade or skiving knife 126 is arranged radially outside of thin film belt 140. Blade 126 should be directed toward the displaced or protruding end of the deflected chips, as will be described in greater detail below.

Laser head 130 is arranged proximate to thin film belt 140 and is directed toward front surface 141A, generally in direction D5. Laser head 130 produces laser 132. In some embodiments, laser head 130 is fixedly secured relative to thin film belt 140. In some embodiments, laser perforation system 110 comprises a plurality of laser heads. In some embodiments, laser head 130 is displaceable with respect to thin film belt 140.

Laser head 130 directs laser or laser beam 132 onto thin film belt 140. Laser 132 passes through both front surface 141A and rear surface 141B of thin film belt 140 in order to produce holes therein. In some embodiments, laser 132 passes only partially through thin film belt 140 (i.e., scores thin film belt 140). As thin film belt 140 continues on its path (i.e., the at least partially cut chips 142 are directed in direction D3), the small curvature of the belt path created by tensioner roller 122 forces partially cut chips 142 to fall out of thin film belt 140 (i.e., removed chips 144) thereby forming holes 146. In some embodiments, the small curvature of the belt path created by tensioner roller 122 forces partially cut chips 142 to deflect or displace radially outward. In such embodiments, blade 126 is arranged to engage the deflected chips to remove them from thin film belt 140. The result of this process is holes or perforations 146 formed in thin film belt 40.

It will be appreciated that various aspects of the disclosure above and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

LIST OF REFERENCE NUMERALS

10 Laser perforation system
12 Enclosure
14A Nozzle or exhaust or outlet
14B Nozzle or exhaust or outlet
16 Support
18 Light stack
20 Drive roller
22 Tensioner roller
24 Backstop
26 Deburring blade or blade or skiving knife
28 Edge sensor
30 Laser head
32 Laser
34 Track or rod
40 Thin film belt
41A Front surface
41B Rear surface
42 Deflected chips
44 Removed chips
46 Holes
46A Hole
46B Hole
48 Center point
50 Line
52 Laser path
54 Laser path
110 Laser perforation system
120 Drive roller
122 Tensioner roller
124 Backstop
126 Deburring blade or blade or skiving knife
130 Laser head
132 Laser
140 Thin film belt
141A Front surface
141B Rear surface
142 Cut chips
144 Removed chips
146 Holes
D1 Direction
D2 Direction
D3 Direction
D4 Direction
D5 Direction
D6 Direction
D7 Direction
D8 Direction
FP1 Flow path
FP2 Flow path
FP3 Flow path
α angle

What is claimed is:

1. A laser perforation system, comprising:
   a drive roller;
   a tensioner roller spaced apart from the drive roller;
   a thin film belt arranged around both the drive roller and tensioner roller, the thin film belt including a front surface facing radially outward and a rear surface facing radially inward;
   a backstop arranged proximate the rear surface of the thin film belt; and,
   a laser head arranged proximate the front surface, the laser head operatively arranged to direct a laser at the thin film belt to create holes therein.

2. The laser perforation system as recited in claim 1, wherein the tensioner roller is displaceable with respect to the drive roller.

3. The laser perforation system as recited in claim 1, further comprising a blade operatively arranged to engage one or more deflected chips on the thin film belt.

4. The laser perforation system as recited in claim 3, wherein the blade is arranged proximate the rear surface of the thin film belt and engages the rear surface.

5. The laser perforation system as recited in claim 3, wherein the blade is arranged proximate the front surface of the thin film belt and engages the front surface.

6. The laser perforation system as recited in claim 1, wherein the drive roller is operatively arranged to displace the thin film belt in a first direction.

7. The laser perforation system as recited in claim 6, wherein the laser head is displaceable with respect to the thin film belt in a second direction and a third direction, the second direction and third direction being perpendicular to the first direction.

8. The laser perforation system as recited in claim 7, further comprising an edge sensor operatively arranged to detect displacement of the thin film belt relative to the drive roller or the tensioner roller in the second direction and the third direction.

9. The laser perforation system as recited in claim 1, wherein:
   the drive roller comprises a first diameter;
   the tensioner roller comprises a second diameter; and,
   the second diameter is less than the first diameter.

10. The laser perforation system as recited in claim 1, further comprising at least one outlet operatively arranged to remove smoke created by the laser contacting the thin film belt and/or the backstop.

11. The laser perforation system as recited in claim 10, wherein the at least one outlet comprises:
   a first outlet arranged radially inside the thin film belt; and,
   a second outlet arranged radially outside the thin film belt.

12. The laser perforation system as recited in claim 1, wherein the thin film belt comprises one of polyethylene terephthalate (PET), polyethylene naphthalate (PEN), and polyamide.

13. The laser perforation system as recited in claim 1, wherein the laser head comprises an ultraviolet (UV) laser marker.

* * * * *